(12) United States Patent
Chen et al.

(10) Patent No.: US 7,382,047 B2
(45) Date of Patent: Jun. 3, 2008

(54) HEAT DISSIPATION DEVICE

(75) Inventors: Chun-Chi Chen, Guangdong (CN); Shi-Wen Zhou, Guangdong (CN); Zhan Wu, Guangdong (CN)

(73) Assignees: Fu Zhun Precision Industry (Shen Zhen) Co., Ltd., Longhua Town, Bao'an District, Shenzhen, Guangdong Province, P.R.C.; Foxconn Technology Co., Ltd., Tu-Cheng, Taipei Hsien (TW)

( * ) Notice: Subject to any disclaimer, the term of this patent is extended or adjusted under 35 U.S.C. 154(b) by 78 days.

(21) Appl. No.: 11/306,412

(22) Filed: Dec. 27, 2005

(65) Prior Publication Data

US 2007/0145572 A1  Jun. 28, 2007

(51) Int. Cl.
*H01L 23/10* (2006.01)
*B23P 6/00* (2006.01)
*F28F 27/00* (2006.01)
*H01B 7/42* (2006.01)

(52) U.S. Cl. ............ 257/706; 257/712; 257/713; 257/722; 257/E31.131; 257/E23.051; 29/890.032; 165/272; 174/15.2

(58) Field of Classification Search ............ 257/276, 257/625, 675, 706, 707, 712–722, 796, E33.075, 257/E31.131, E23.051, E23.08–E23.113; 174/15.2; 165/272; 29/890.032
See application file for complete search history.

(56) References Cited

U.S. PATENT DOCUMENTS

| | | | |
|---|---|---|---|
| 6,394,175 B1 * | 5/2002 | Chen et al. ............ | 165/80.3 |
| 6,650,536 B2 | 11/2003 | Lee et al. | |
| 6,745,824 B2 * | 6/2004 | Lee et al. ............ | 165/104.14 |
| 7,059,391 B2 * | 6/2006 | Whitney ............ | 165/104.33 |
| 2004/0190261 A1 * | 9/2004 | Lopatinsky et al. ........ | 361/704 |

* cited by examiner

*Primary Examiner*—Jasmine J Clark
(74) *Attorney, Agent, or Firm*—Winston Hsu

(57) ABSTRACT

A heat dissipation device (1) includes a heat sink (10), a fan (20), and a cooling member (30). The heat sink includes a base, a plurality of fins extending from the base and at least one heat pipe thermally connecting the base and the fins. The cooling member is provided with a fin assembly thereon and includes a cold surface attached to one side of the fins and a condensing portion of the at least one heat pipe to make the one side of the fins and the condensing portion have a lower temperature.

19 Claims, 5 Drawing Sheets

HEAT DISSIPATION DEVICE

FIELD OF THE INVENTION

The present invention generally relates to a heat dissipation device, and more particularly to a heat dissipation device having a high heat dissipating capacity.

DESCRIPTION OF THE RELATED ART

As computer technology continues to advance, electronic components such as central processing units (CPUs) of computers are being made to provide faster operational speeds and greater functional capabilities. When a CPU operates at high speed in a computer enclosure, its temperature can increase greatly. It is desired to dissipate the heat quickly, for example by using a heat dissipation device attached to the CPU in the enclosure. This allows the CPU and other electronic components in the enclosure to function within their normal operating temperature ranges, thereby assuring the quality of data management, storage and transfer. A conventional heat dissipation device attached to the CPU comprises a heat sink and at least a pair of heat pipes disposed on the heat sink to enhance the heat transfer of the heat sink. By the provision of the heat pipes, heat dissipation efficiency of the heat dissipation device is improved.

However, as computer technology becomes more and more complicated, the conventional heat dissipation device can not satisfy the demand of the heat dissipation of the CPU which produce more and more heat than before. The heat dissipating capacity of the conventional heat dissipation device needs improvement greatly. A factor that can determine the heat dissipating capacity of the heat dissipation device is the heat dissipating ability of condensing sections of the heat pipes. Working liquid in the heat pipes absorbs the heat from the CPU and evaporates into vapor at evaporating sections of the heat pipes. The vapor releases the heat at the condensing section whereby the vapor is condensed into liquid. The speed of the heat release of the vapor affects the performance of the heat pipes and accordingly the performance of the heat dissipation device incorporating the heat pipes. The heat dissipating ability of the condensing sections affects the heat release of the vapor. Generally the condensing sections are fitted with fins to enhance the heat dissipating ability thereof. However, such a design is not effective enough to meet the more and more demanding heat dissipation requirement of modern electronic devices.

SUMMARY OF INVENTION

A heat dissipation device in accordance with a preferred embodiment of the present invention comprises a heat sink, a fan, and a cooling member. The heat sink includes a base, a plurality of fins extending from the base and at least one heat pipe thermally connecting the base and the fins. The cooling member is provided with a fin assembly thereon and includes a cold surface attached to one side of the fins and a condensing section of the at least one heat pipe to make the one side of the fins and the condensing section of the at least one heat pipe having a much lower temperature. Accordingly, heat carried by vapor in the at least one heat pipe is able to be quickly released at the condensing section. Therefore, the heat dissipating capability of the at least one heat pipe and the heat dissipation device is enormously improved.

Other advantages and novel features will become more apparent from the following detailed description of preferred embodiments when taken in conjunction with the accompanying drawings, in which:

DETAILED DESCRIPTION

Figure 1:
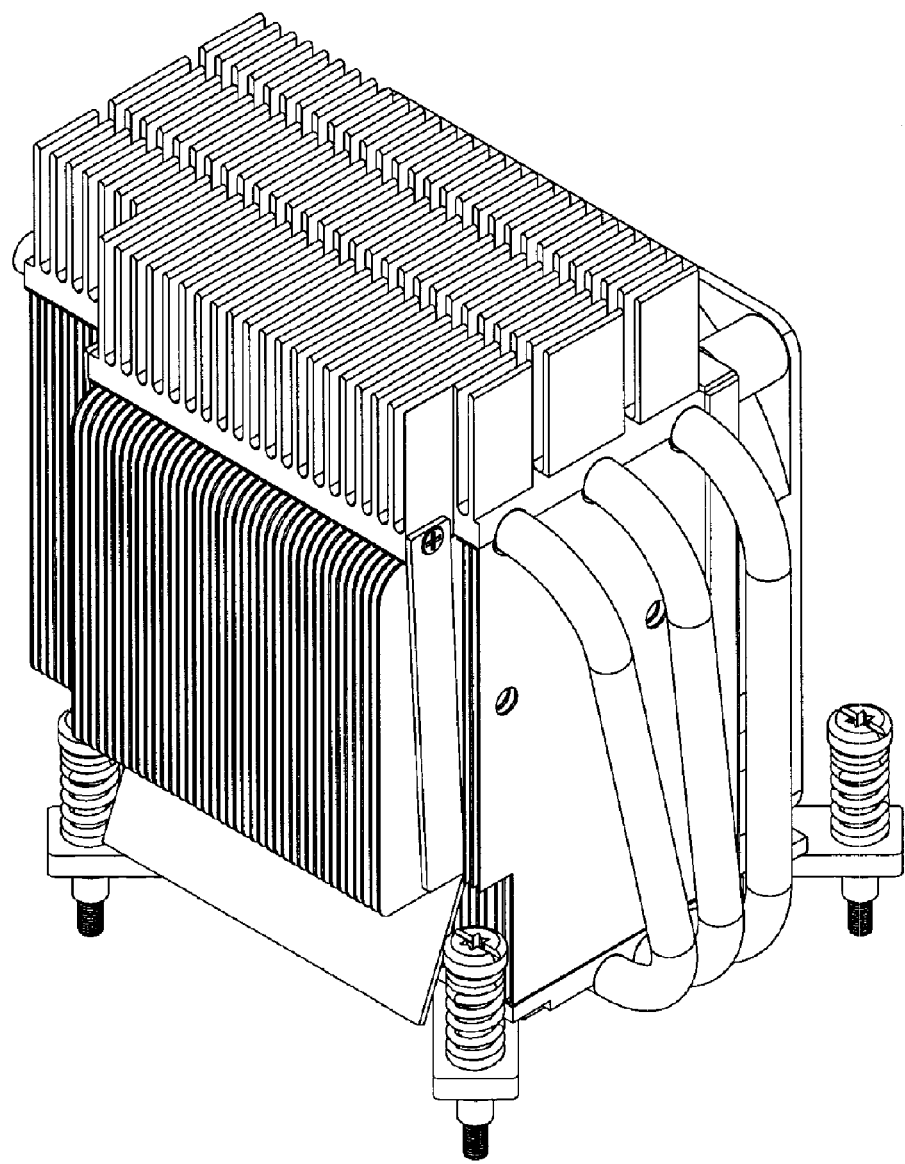
FIG. 1 is an assembled view of a heat dissipation device in accordance with a first preferred embodiment of the present invention.
Figure 2:
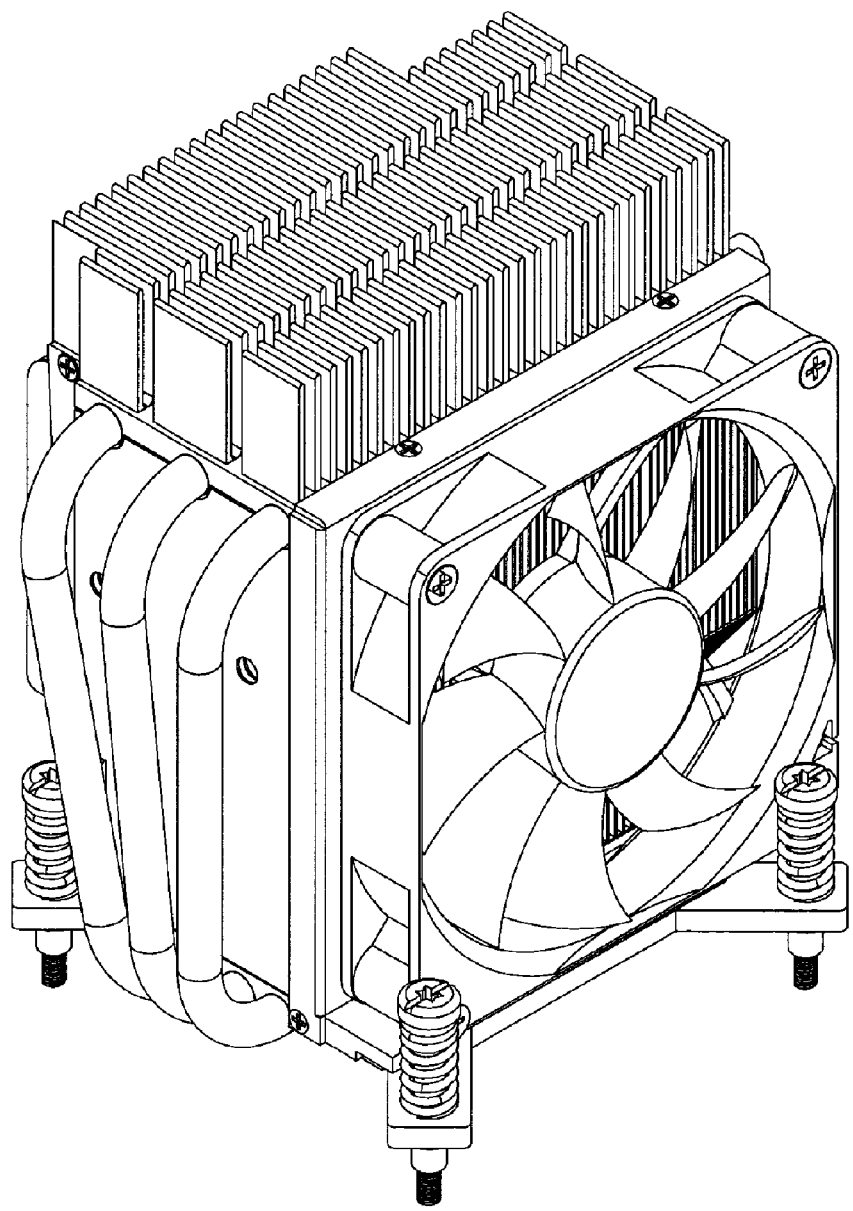
FIG. 2 is similar to FIG. 1, but viewed from another aspect.

Referring to FIGS. 1-2, a heat dissipation device 1 in accordance with a preferred embodiment of the invention comprises a heat sink 10, a fan 20 arranged on a lateral side of the heat sink 10 via a fan holder 22, a cooling member 30 disposed on a top of the heat sink 10 and an airflow guider 40 mounted on another lateral side of the heat sink 10 and opposite the fan 20.

The heat sink 10 comprises a base 12, a plurality of fins 14 extending from the base 12 and three heat pipes 16 thermally connecting the base 12 and a top of the fins 14. The base 12 defines a plurality of first grooves (not labeled) in a bottom surface thereof, and the bottom surface of the base 12 is attached to a heat-generating electronic component (not shown) such as a CPU. A plurality of second grooves (not shown in FIG. 2) is defined in the top of the fins 14. Each heat pipe 16 has an evaporating portion (not labeled) accommodated in one of the first grooves and a condensing portion (not labeled) accommodated in one of the second grooves in the top of the fins 14. The evaporating portions of the heat pipes 16 absorb heat produced by the heat-generating electronic component and transfer the heat directly to the top of the fins 14. Then, the fins 14 dissipate the heat to a surrounding atmosphere via an airflow generated by the fan 20 and flowing through the heat sink 10.

Figure 3:
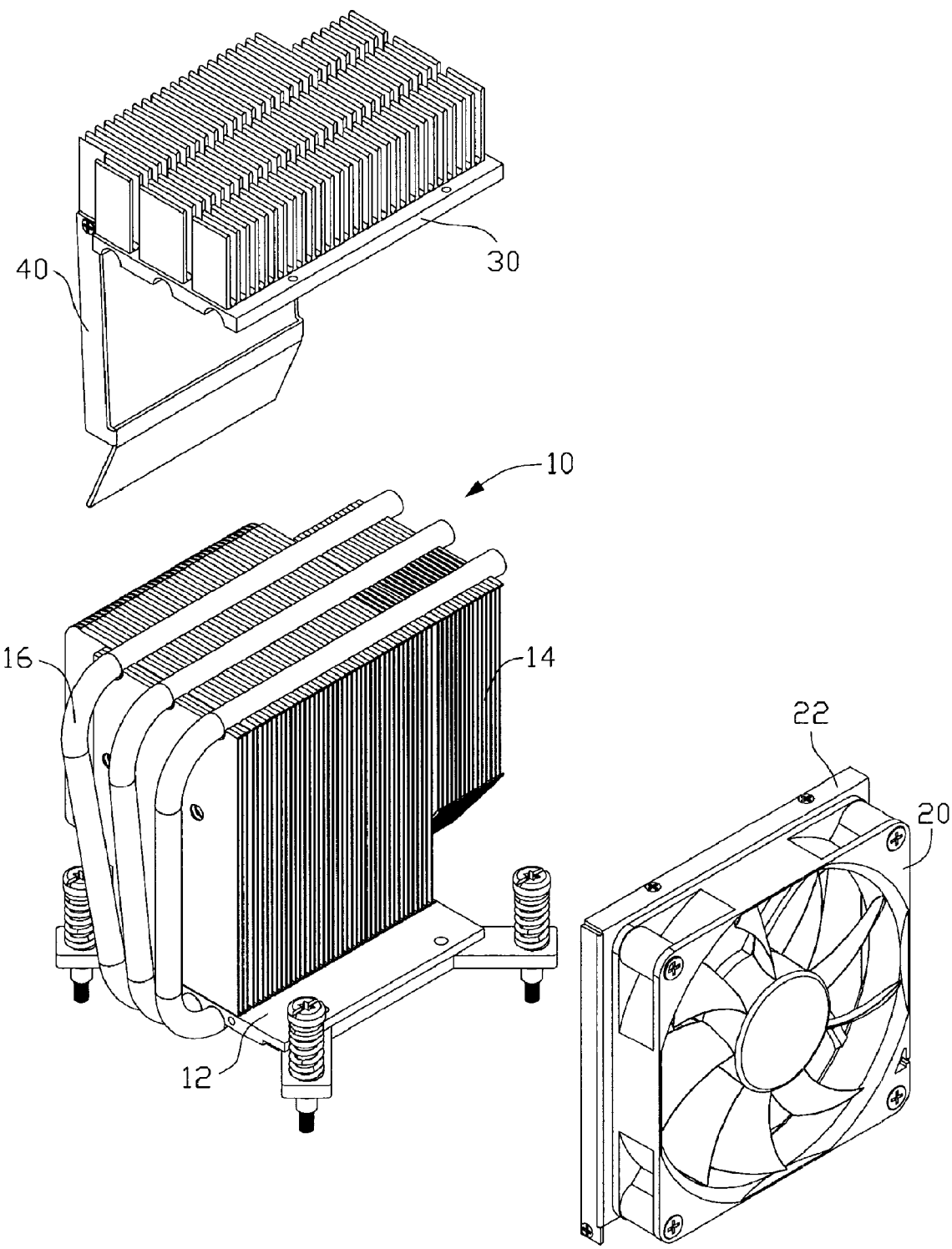
FIG. 3 is an exploded view of FIG. 2.
Figure 4:
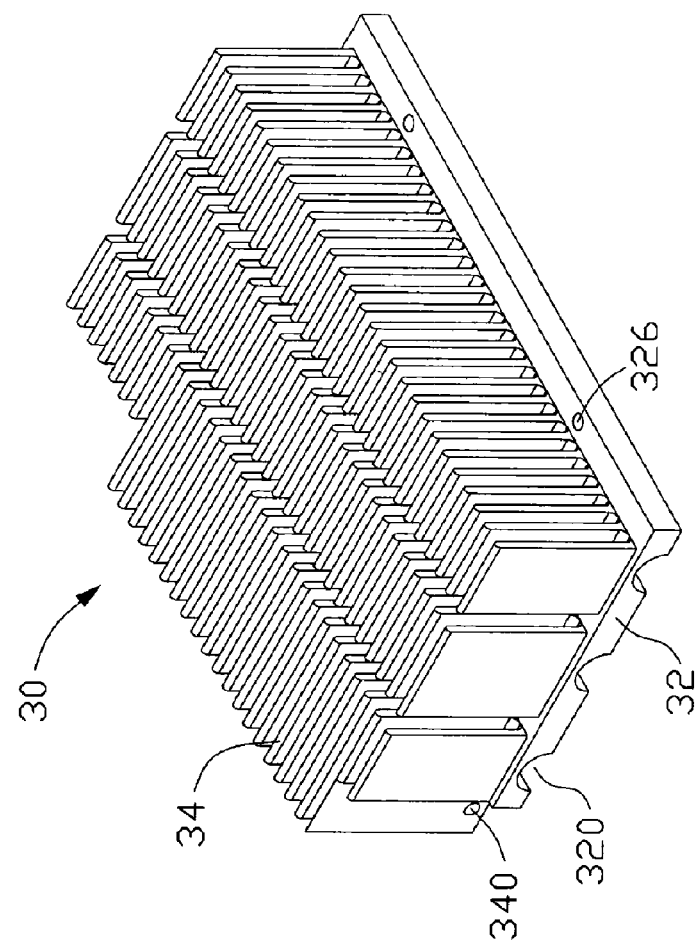
FIG. 4 is an exploded view of a part of the heat dissipation device of FIG. 2, the part including a cooling member and an airflow guider.
Figure 4:
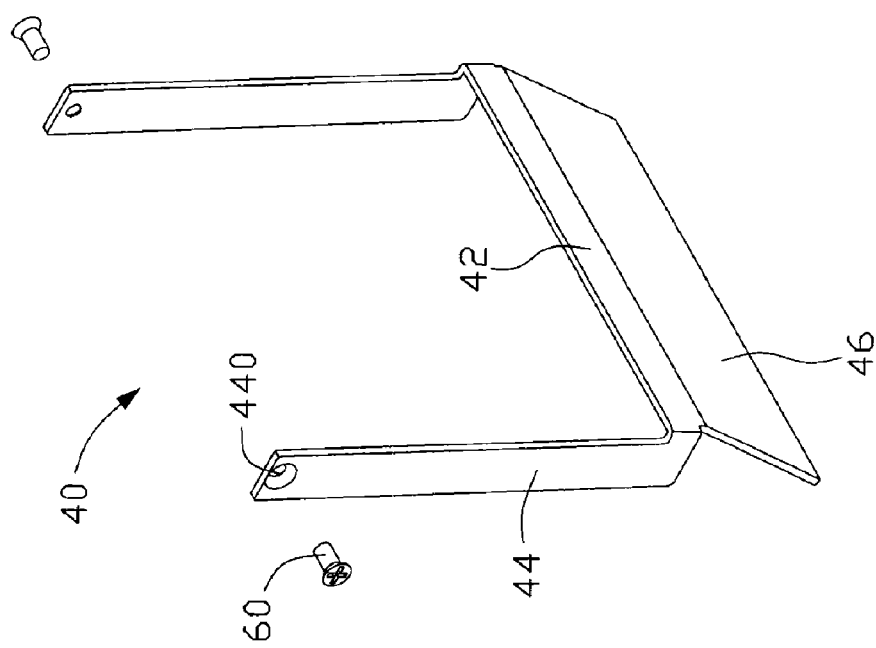

Also referring to FIGS. 3-4, the cooling member 30 comprises a thermoelectric cooler 32 and a fin assembly 34 disposed on a top surface of the thermoelectric cooler 32. The thermoelectric cooler 32 is a semiconductor, which can be polarized to generate a cold surface 322 and a hot surface 324 when it is applied with an electrical voltage. The cold surface 322 is in thermal contact with the top of the fins 14 and the condensing portions of the heat pipes 16. The thermoelectric cooler 32 defines three slots 320 in a bottom thereof for accommodating the condensing portions of the heat pipes 16 and a pair of through holes 326 in a side of the thermoelectric cooler 32. Screws (not labeled and better seen in FIGS. 2 and 3) are used for extending through the fan holder 22 and screwed into the through holes 326 for securing the fan holder 22 to the side of the thermoelectric cooler 32. The slots 320 cooperate with the second grooves in the top of the fins 14 to form passages (not shown) accommodating the condensing portions of the heat pipes 16 therein. The fin assembly 34 defines a pair of screw holes 340 in front and rear sides thereof, respectively. The screw holes 340 are adjacent to a bottom and a lateral side of the fin assembly 34.

The airflow guider 40 comprises a body 42, a pair of support portions 44 extending upwardly from two sides of the body 42 and a baffle 46 extending rearwards and downwardly from a bottom of the body 42. Each support portion 44 defines a mounting hole 440 at an upper end thereof. The baffle 46 is used to guide the airflow from the fan 20 through the fins 14 to flow downward and rearwards, so that the airflow can be further utilized to cool other electronic components, such as a power chip, located near the heat-generating electronic component (for example, the CPU). The body 42 rests on the another lateral side of the heat sink 10 and the support portions 44 sandwich the another lateral side therebetween. Two screws 60 are used to extend through the mounting holes 440, and screw into the screw holes 340, thereby fastening the airflow guider 40 on the another lateral side of the heat sink 10.

Figure 5:
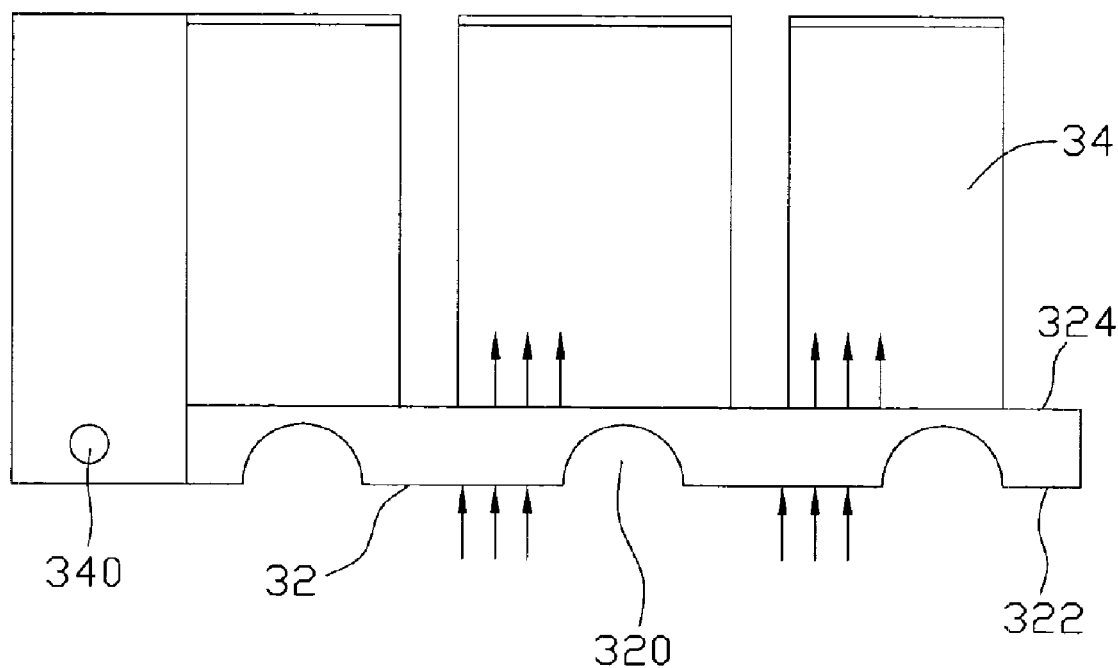
FIG. 5 is a lateral side view of the cooling member of FIG. 4, showing heat dissipation paths through the cooling member.

In operation, referring to FIG. 5, when an electrical current is applied to the thermoelectric cooler 32, which uses the Peltier effect for heat transfer, will absorb heat from the cold surface 322 thereof which is in thermal contact with the top of the fins 14 and the condensing portions of the heat pipes 16 and release the heat from the hot surface 324 to the fin assembly 34 (shown as arrows). Thus, the top of the fins 14 and the condensing portions of the heat pipes 16 can be quickly cooled. A large temperature gradient is thus achieved between the top and the bottom of the fins 14 and the condensing portions and the evaporating portions of the heat pipes 16. A result of the large temperature gradient is that the heat pipes 16 are sufficiently used to transfer the heat from the base 12 where the highest temperature exists to the top of the fins 14 where the lowest temperature exists, to efficiently dissipate the heat of the heat-generating electronic component. Therefore, the heat of the heat-generating electronic component is continuously transferred to the top of the fins 14 and the condensing portions of the heat pipes 16 via the evaporating portions of the heat pipes 16 and dissipated by the fin assembly 34 of the cooling member 30 and the fins 14 to ambient air. The heat dissipation efficiency of the heat sink 10 can thus be improved.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device comprising:
   a heat sink adapted for thermally contacting with a heat generating component, the heat sink comprising at least a heat pipe having an evaporating portion adapted for absorbing heat from the heat generating component and a condensing portion for dissipating the heat; and
   a cooling member having a cold surface attached to one part of the heat sink and the condensing portion of the at least a heat pipe to make the one part of the heat sink and the condensing portion of the at least a heat pipe have a temperature lower than any other part of the heat sink and the evaporating portion, respectively;
   wherein the cooling member comprises a thermoelectric cooler attached on the one part of the heat sink and the condensing portion of the at least a heat pipe.

2. The heat dissipation device as claimed in claim 1, wherein the cooling member further comprises a fin assembly attached on the thermoelectric cooler.

3. The heat dissipation device as claimed in claim 1, wherein the heat sink comprises a base, a plurality of fins extending from the base and three heat pipes thermally connecting the base and the fins.

4. The heat dissipation device as claimed in claim 3, wherein the cooling member is arranged on a top of the fins and attached to the condensing portion of each heat pipe.

5. The heat dissipation device as claimed in claim 4, wherein the evaporating portion of each heat pipe is received in the base and the condensing portion of each heat pipe is received in the top of the fins, the condensing portion being attached with the cold surface of the cooling member.

6. The heat dissipation device as claimed in claim 5, wherein the thermoelectric cooler defines three grooves in a bottom thereof respectively accommodating the condensing portions of the heat pipes.

7. The heat dissipation device as claimed in claim 6, wherein a fan is arranged at a lateral side of the heat sink.

8. A heat dissipation device comprising:
   a heat sink adapted for contacting with a heat-generating electronic component, the heat sink comprising a base, a plurality of fins extending from the base and at least one heat pipe thermally connecting the base and the fins; and
   a thermoelectric cooler having a fin assembly thereon, the thermoelectric cooler comprising a cold surface attached to one side of the fins and the at least one heat pipe to make the one side of the fins having a lower temperature than any other part of the fins.

9. The heat dissipation device as claimed in claim 8, wherein the at least one heat pipe comprises an evaporating portion received in the base and a condensing portion received in a top of the fins, the thermoelectric cooler being in thermal contact with the top of the fins and the condensing portion.

10. The heat dissipation device as claimed in claim 9, wherein the thermoelectric cooler defines a slot in a bottom thereof for accommodating the condensing portion of the at least one heat pipe.

11. The heat dissipation device as claimed in claim 10, wherein the thermoelectric cooler includes a semiconductor having Peltier effect, the top of the fins being in thermal contact with a cool side of the semiconductor.

12. The heat dissipation device as claimed in claim 11, further comprising a fan arranged on a lateral side of the heat sink.

13. The heat dissipation device as claimed in claim 12, further comprising an airflow guider arranged on another lateral side of the heat sink and opposite the fan, the air guider being used for guiding an airflow generated by the fan to flow downwardly.

14. A heat dissipation device comprising:
   a heat sink having a base adapted for contacting with a heat-generating electronic component;
   a heat pipe having an evaporating portion thermally connecting with the base and a condensing portion; and
   a thermoelectric cooler being applied with an electrical voltage to have a cold surface and a hot surface, wherein the cold surface is thermally connected with the condensing portion of the heat pipe.

15. The heat dissipation device as claimed in claim 14 further comprising a fin assembly engaging with the hot surface of the thermoelectric cooler.

16. The heat dissipation device as claimed in claim 15, wherein the condensing portion of the heat pipe is sandwiched between a top of the heat sink and the cold surface of the thermoelectric cooler.

17. The heat dissipation device as claimed in claim 16 further comprising a fan for generating an airflow through the heat sink.

18. The heat dissipation device as claimed in claim 17 further comprising a guider for guiding the airflow to flow downwardly.

19. The heat dissipation device as claimed in claim 16, wherein the base has a groove in a bottom surface thereof, the evaporating portion of the heat pipe is received in the groove.

* * * * *